United States Patent
Ting et al.

(10) Patent No.: US 11,147,152 B2
(45) Date of Patent: Oct. 12, 2021

(54) GLASS ASSEMBLY, MANUFACTURING METHOD THEREOF, AND GLASS WINDOW

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Tienlun Ting, Beijing (CN); Xiangzhong Kong, Beijing (CN); Lei Wang, Beijing (CN); Ken Wen, Beijing (CN); Tuo Sun, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 272 days.

(21) Appl. No.: 16/477,813

(22) PCT Filed: Dec. 4, 2018

(86) PCT No.: PCT/CN2018/119027
§ 371 (c)(1),
(2) Date: Jul. 12, 2019

(87) PCT Pub. No.: WO2019/196436
PCT Pub. Date: Oct. 17, 2019

(65) Prior Publication Data
US 2020/0396822 A1    Dec. 17, 2020

(30) Foreign Application Priority Data

Apr. 11, 2018   (CN) .......................... 201810320170.6

(51) Int. Cl.
*H05K 9/00* (2006.01)
*H05H 1/48* (2006.01)

(52) U.S. Cl.
CPC ............. *H05H 1/48* (2013.01); *H05K 9/0005* (2013.01); *H05K 9/0052* (2013.01); *H05K 9/0094* (2013.01)

(58) Field of Classification Search
CPC .......................... H05K 9/0005; H05K 9/0094
See application file for complete search history.

(56) References Cited

U.S. PATENT DOCUMENTS

| 4,895,734 A | * | 1/1990 | Yoshida | .............. C03C 17/3417 427/109 |
| 2004/0033384 A1 | * | 2/2004 | Funkenbusch | ....... H05K 9/0094 428/626 |

(Continued)

FOREIGN PATENT DOCUMENTS

| CN | 1674202 A | 9/2005 |
| CN | 201184113 Y | 1/2009 |

(Continued)

OTHER PUBLICATIONS

First Office Action for CN Appl. No. 201810320110.6, dated Feb. 3, 2019.

*Primary Examiner* — Hung V Ngo
(74) *Attorney, Agent, or Firm* — The Webb Law Firm (57) ABSTRACT

The present disclosure provides a glass assembly, a manufacturing method thereof and a glass window. The glass assembly includes: a first glass plate and a second glass plate disposed opposite to each other, wherein inert gas is filled between the first glass plate and the second glass plate; a first electrode and a second electrode disposed between the first glass plate and the second glass plate, the inert gas is transformed into plasma in the case where an electric field is generated using the first electrode and the second electrode.

20 Claims, 4 Drawing Sheets

(56) References Cited

U.S. PATENT DOCUMENTS

| | | | | |
|---|---|---|---|---|
| 2008/0143906 A1* | 6/2008 | Allemand | ............... | B82Y 30/00 |
| | | | | 349/43 |
| 2009/0073364 A1* | 3/2009 | Matsuno | ........... | G02F 1/134363 |
| | | | | 349/138 |
| 2010/0002176 A1* | 1/2010 | Kondo | .............. | G02F 1/134363 |
| | | | | 349/122 |
| 2010/0243295 A1* | 9/2010 | Allemand | ............ | H05K 9/0092 |
| | | | | 174/250 |
| 2011/0032622 A1* | 2/2011 | Kim | ....................... | G02B 5/285 |
| | | | | 359/609 |
| 2012/0125660 A1* | 5/2012 | Bright | .................. | C23C 14/024 |
| | | | | 174/126.4 |
| 2018/0067083 A1* | 3/2018 | Shinada | ............. | G01N 33/0027 |
| 2018/0352664 A1* | 12/2018 | Park | ........................ | B32B 27/16 |

FOREIGN PATENT DOCUMENTS

| | | | |
|---|---|---|---|
| CN | 101439342 | A | 5/2009 |
| CN | 201742637 | U | 2/2011 |
| CN | 102946685 | A | 2/2013 |
| CN | 104756334 | A | 7/2015 |
| CN | 204876738 | U | 12/2015 |
| CN | 108323146 | A | 7/2018 |

\* cited by examiner

GLASS ASSEMBLY, MANUFACTURING METHOD THEREOF, AND GLASS WINDOW

CROSS-REFERENCE TO RELATED APPLICATIONS

The present application is a U.S. National Stage Application under 35 U.S.C. § 371 of International Patent Application No. PCT/CN2018/119027, filed on Dec. 4, 2018, which claims priority to CN Application No. 201810320170.6 filed on Apr. 11, 2018, the disclosed content of both of which are hereby incorporated by reference in the present application in entirety.

TECHNICAL FIELD

The present disclosure relates to the field of electromagnetic shielding, and in particular to a glass assembly, a manufacturing method thereof, and a glass window.

BACKGROUND

Electromagnetic shielding of a designated area is generally implemented in the related art by surrounding the designated area with a Faraday cage.

The Faraday cage is a cage body formed of metal or a good conductor, which is connected to the earth. Since the cage body is an equipotential volume, the internal potential difference is zero, and thus the inside of the cage body can be protected from external electric fields, thereby achieving electrostatic shielding.

SUMMARY

According to a first aspect of the embodiments of the present disclosure, there is provided a glass assembly comprising: a first glass plate and a second glass plate disposed opposite to each other, wherein inert gas is filled between the first glass plate and the second glass plate; a first electrode and a second electrode disposed between the first glass plate and the second glass plate, wherein the inert gas is transformed into plasma in the case where an electric field is generated using the first electrode and the second electrode.

In some embodiments, the first electrode includes at least one first sub-electrode, and the second electrode includes at least one second sub-electrode; the first sub-electrode and the second sub-electrodes are alternately disposed on a surface of the first glass plate.

In some embodiments, the first sub-electrode and the second sub-electrode are strip-shaped and extend in the same direction.

In some embodiments, on a surface of the first glass plate, a distance between a first sub-electrode and the second sub-electrode adjacent to the first sub-electrode is greater than a width of the first sub-electrode and greater than a width of the second sub-electrode.

In some embodiments, on a surface of the first glass plate, a height of the first sub-electrode is smaller than a skin depth of the first sub-electrode in spatial electromagnetic wave, and a height of the second sub-electrode is smaller than a skin depth of the second sub-electrode in spatial electromagnetic wave.

In some embodiments, the first electrode further includes at least one third sub-electrode, and the second electrode further includes at least one fourth sub-electrode; the third sub-electrode and the fourth sub-electrodes are alternately disposed on a surface of the second glass plate.

In some embodiments, the third sub-electrodes and the fourth sub-electrodes are strip-shaped and extend in the same direction as the first sub-electrode and the second sub-electrode.

In some embodiments, a distance between a third sub-electrode and an adjacent fourth sub-electrode is greater than a width of the third sub-electrode and greater than a width of the fourth sub-electrode on a surface of the second glass plate.

In some embodiments, on a surface of the second glass plate, a height of the third sub-electrode is smaller than a skin depth of the third sub-electrode under spatial electromagnetic wave, and a height of the fourth sub-electrode is smaller than a skin depth of the fourth sub-electrode under spatial electromagnetic wave.

In some embodiments, projections of the first sub-electrode and the third sub-electrode on the first glass plate coincide with each other; projections of the second sub-electrode and the fourth sub-electrode on the first glass plate coincide with each other.

In some embodiments, a sum of a height of the first sub-electrode and a height of the third sub-electrode is smaller than a skin depth of the first sub-electrode in spatial electromagnetic wave, and is smaller than a skin depth of the third sub-electrode in spatial electromagnetic wave; a sum of a height of the second sub-electrode and a height of the fourth sub-electrode is smaller than a skin depth of the second sub-electrode in spatial electromagnetic wave and is smaller than a skin depth of the fourth sub-electrode in spatial electromagnetic wave.

In some embodiments, the first sub-electrode, the second sub-electrode, the third sub-electrode and the fourth sub-electrode are transparent electrodes.

In some embodiments, the first and second electrodes are disposed opposite to each other.

In some embodiments, the first electrode is disposed on a surface of the first glass plate, and the second electrode is disposed on a surface of the second glass plate.

In some embodiments, a height of the first electrode is smaller than a skin depth of the first electrode in spatial electromagnetic wave, and a height of the second electrode is smaller than a skin depth of the second electrode in spatial electromagnetic wave.

In some embodiments, the first electrode and the second electrode are transparent electrodes.

In some embodiments, the first electrode and the second electrode are disposed on opposite edges of the glass assembly.

In some embodiments, the first electrode and the second electrode are metal electrodes.

According to a second aspect of the embodiments of the present disclosure, a glass window is provided. The glass window includes a glass assembly according to any of the aforementioned embodiments.

According to a third aspect of the embodiments of the present disclosure, there is provided a method of making a glass assembly, comprising: disposing a first glass plate and a second glass plate opposite to each other, wherein inert gas is filled between the first plate and the second glass plate; disposing a first electrode and a second electrode between the first glass plate and the second glass plate, the inert gas is transformed into plasma in the case where an electric field is generated using the first electrode and the second electrode.

Further features of the present disclosure, as well as advantages thereof, will become clearer from the following detailed description of exemplary embodiments of the present disclosure with reference to the accompanying drawings.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure may be understood more clearly from the following detailed description with reference to the accompanying drawings, wherein.

It should be understood that the dimensions of the various parts shown in the drawings are not drawn according to the actual proportional relationship. In addition, the same or similar reference signs denote the same or similar components.

DETAILED DESCRIPTION

The exemplary embodiments of the present disclosure will be described in detail with reference to the accompanying drawings. The description of the exemplary embodiments is intended to be merely illustrative, and is not meant to be limitation on the present disclosure and its application or use in any way. The present disclosure may be implemented in many different forms, not limited to the embodiments described herein. These embodiments are provided so that this disclosure will be thorough and complete, and will fully convey the scope of the disclosure to those skilled in the art. It should be noted that, unless otherwise specified, relative arrangement of components and steps, ingredients of the materials, numerical expressions and numerical values set forth in these embodiments are to be construed as merely illustrative, not as a limitation.

The terms "first", "second" and similar words used in the present disclosure do not denote any order, quantity, or importance, but merely serve to distinguish different parts. Similar words like "include" or "comprise" mean that the element that precedes the word covers the elements listed after that term, but does not exclude the possibility of also covering other elements. "Up", "Down", "Left", "Right", and the like are used only to indicate a relative positional relationship, and when the absolute position of the described object is changed, the relative positional relationship may also change correspondingly.

Unless otherwise specifically defined, all terms (including technical terms or scientific terms) used in the present disclosure have the same meanings as understood by an ordinary person skilled in the art to which the present disclosure belong. It will also be understood that terms defined in, for example, common dictionaries should be interpreted as having meanings that are consistent with their meanings in the context of the relevant art, and should not be interpreted in an idealized or extremely formal sense unless expressly defined here.

Techniques, methods, and devices known to an ordinary person skilled in the relevant art may not be discussed in detail but, where appropriate, such techniques, methods, and devices are to be considered part of the description.

The inventors discovered through research that the Faraday cage need occupy a large space and cannot be installed in a space-limited environment. In addition, in the area enclosed by the Faraday cage, the user cannot choose whether to perform electromagnetic shielding according to the demand.

To this end, the inventor proposes a technical solution that can be installed in a limited space environment and can switch the electromagnetic shielding function according to the user's demand.

Figure 1:
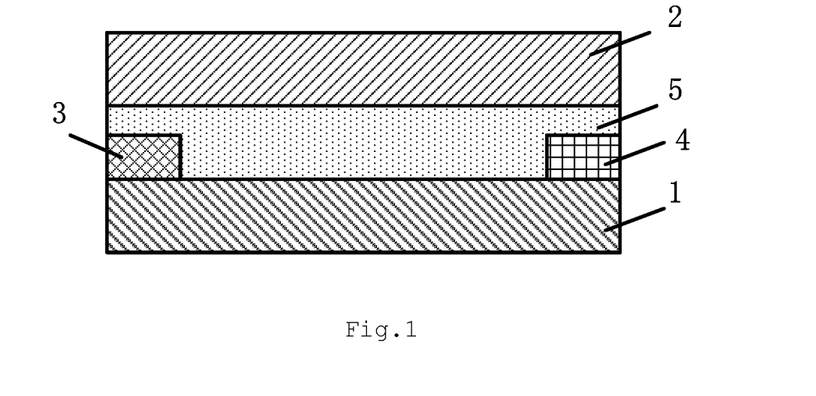
FIG. 1 is a structural diagram of a glass assembly according to one embodiment of the present disclosure.

FIG. 1 is a structural diagram of a glass assembly according to one embodiment of the present disclosure.

As shown in FIG. 1, the glass assembly comprises a first glass plate 1, a second glass plate 2, a first electrode 3 and a second electrode 4.

The first glass plate 1 and the second glass plate 2 are disposed opposite to each other. Inert gas 5 is filled between the first glass plate 1 and the second glass plate 2. The first electrode 3 and the second electrode 4 are disposed between the first glass plate 1 and the second glass plate 2. The inert gas 5 is transformed into plasma in the case where an electric field is generated using the first electrode 3 and the second electrode 4.

Under the action of the electric field, the molecules in the inert gas are set free, and the inert gas is transformed into the plasma accordingly. The plasma can absorb the energy of the electromagnetic wave, which can be converted into a fluctuation of the plasma, thereby to shield the electromagnetic wave.

In some embodiments, the first electrode 3 is connected to a positive voltage, and the second electrode 4 is grounded. Since there is a potential difference between the first electrode 3 and the second electrode 4, an electric field is generated between the first glass plate 1 and the second glass plate 2, and the electric field transforms the inert gas 5 into the plasma. In some embodiments, the positive voltage connected to the first electrode 3 is between 100 volts and 1000 volts.

It should be noted that if the inert gas 5 filled between the first glass plate 1 and the second glass plate 2 has a certain concentration, electromagnetic shielding can be better achieved. In some embodiments, the number of atoms per cubic meter of inert gas ranges from $10^{14}$ to $10^{20}$, thereby shielding an electromagnetic signal having a frequency above 900 MHz.

In some embodiments, if the voltage applied to the first electrode 3 and the second electrode 4 is canceled, the potential difference between the first electrode 3 and the second electrode 4 is zero. The electric field between the first glass plate 1 and the second glass plate 2 also disappears, and the inert gas 5 restores to the original state. In this case, the inert gas 5 no longer has an electromagnetic shielding function for the electromagnetic wave, and the electromagnetic wave can freely pass through the glass component. That is, by controlling the potential difference between the first electrode 3 and the second electrode 4, the electromagnetic shielding function of the glass assembly can be freely switched.

In the glass assembly provided by the above embodiments of the present disclosure, by adjusting the potential difference between the first electrode and the second electrode, the inert gas between the first glass plate and the second glass plate can be transformed into the plasma when the electromagnetic shielding is required. Thereby, the electromagnetic shielding function can be switched according to the user's demand in a space-limited environment.

Figure 2:
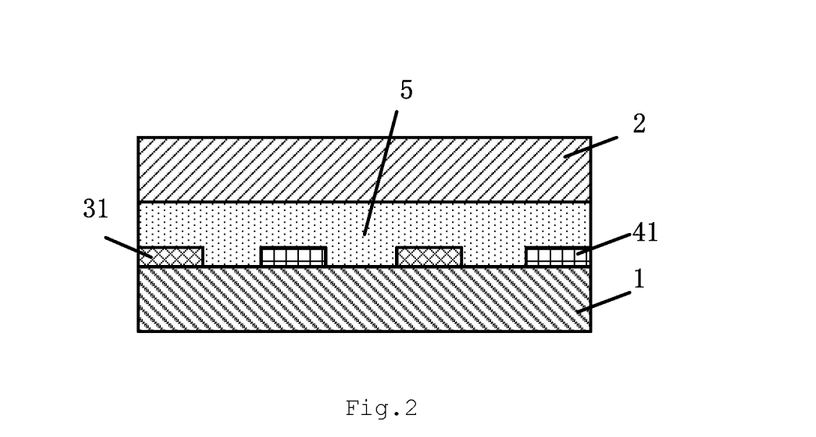
FIG. 2 is a structural diagram of a glass assembly according to another embodiment of the present disclosure.

FIG. 2 is a structural diagram of a glass assembly according to another embodiment of the present disclosure.

As shown in FIG. 2, the first electrode 3 includes at least one first sub-electrode 31, and the second electrode 4 includes at least one second sub-electrode 41. The first sub-electrodes 31 and the second sub-electrodes 41 are alternately disposed on a surface of the first glass plate 1. The first sub-electrode 31 and the second sub-electrode 41 which is adjacent to the first sub-electrode 31 are spaced apart by a gap.

In some embodiments, each of the first sub-electrode 31 has the same width and height, and each of the second sub-electrode 41 has the same width and height.

In some embodiments, the first sub-electrodes 31 is connected to a positive voltage, and the second sub-electrodes 41 is grounded. Since there is a potential difference between the first sub-electrode 31 and an adjacent second sub-electrode 41, the electric field is generated between the first sub-electrode 31 and the adjacent second sub-electrode 41, thereby to transform the inert gas 5 into the plasma.

In some embodiments, the first sub-electrode 31 and the second sub-electrode 41 are transparent electrodes. For example, the transparent electrode are made of an ITO (Indium Tin Oxide) film or other transparent conductive films. Thereby, it is possible to prevent the first sub-electrode 31 and the second sub-electrode 41 from affecting the user's line of sight.

In some embodiments, on a surface of the first glass plate 1, a height of a first sub-electrode 31 is smaller than a skin depth of the first sub-electrode 31 in spatial electromagnetic wave, and a height of a second sub-electrode 41 is smaller than a skin depth of the second sub-electrode 41 in spatial electromagnetic wave.

It should be noted here that a skin effect occurs when a high-frequency current passes through the conductor. That is, the current is mainly transmitted on the surface of the conductor, and almost no current flows through the inside of the conductor. The depth at which the current collects on the surface of the conductor is called the skin depth.

In some embodiments, the height of the first sub-electrode 31 and the height of the second sub-electrode 41 are smaller than the corresponding skin depth, thereby enabling the electromagnetic wave to better pass through the glass assembly. However, in the case where electromagnetic shielding is not required, the first sub-electrode 31 and the second sub-electrode 41 will not affect the normal use of electromagnetic wave by the user. For example, the electromagnetic wave may be a wireless communication signal such as a mobile network signal or a WIFI (Wireless Fidelity) signal. Normal use of a user mobile terminal will not be affected when there is not a potential difference between the first sub-electrode 31 and the second sub-electrode 41.

In some embodiments, the height of the first sub-electrode 31 and the height of the second sub-electrode 41 are respectively less than one-fifth of the skin depth. Thus, the electromagnetic wave can smoothly pass through the glass assembly when the user does not have a demand of electromagnetic shielding.

In some embodiments, a distance between the first sub-electrode 31 and the adjacent second sub-electrode 41 is greater than the width of the first sub-electrode 31 and greater than the width of the second sub-electrode 41. The distance between two adjacent sub-electrodes is greater than the widths of the two sub-electrodes so that the generated electric field can act more fully on the inert gas.

By adjusting the distance between the adjacent sub-electrodes, the intensity of the generated electric field can be made more favorable for transforming the inert gas into the plasma. For example, the distance between the adjacent sub-electrodes is less than 200 microns.

In some embodiments, the voltage applied to the sub-electrodes is adjusted according to the distance between the adjacent sub-electrodes.

In some embodiments, the first sub-electrode 31 and the second sub-electrode 41 are strip-shaped and extend in the same direction.

It should be noted that, in the case where the distance between the adjacent sub-electrodes is smaller than the wavelength of the electromagnetic wave, the electromagnetic wave parallel to the direction in which the sub-electrode extends cannot pass smoothly, whereas the electromagnetic wave perpendicular to the direction in which the sub-electrode extends will pass through smoothly. Therefore, by setting the extending directions of the first sub-electrode 31 and the second sub-electrode 41 to be the same direction, it is possible to better reduce the loss of the electromagnetic wave when passing through the glass assembly. For example, for a randomly polarized or circularly polarized signal, the loss generated when passing through the glass assembly does not exceed 3 dB.

Figure 3:
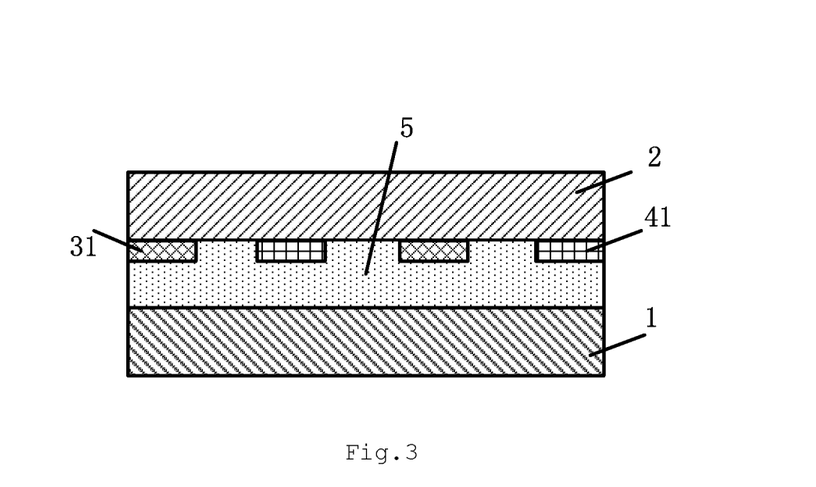
FIG. 3 is a structural diagram of a glass assembly according to still another embodiment of the present disclosure.

FIG. 3 is a structural diagram of a glass assembly according to a still another embodiment of the present disclosure. FIG. 3 differs from FIG. 2 in the position of setting the sub-electrode.

In the embodiment shown in FIG. 2, the first sub-electrodes 31 and the second sub-electrodes 41 are alternately disposed on a surface of the first glass plate 1. In the embodiment shown in FIG. 3, the first sub-electrodes 31 and the second sub-electrodes 41 are alternately disposed on a surface of the second glass plate 2.

It should be noted that no matter the first sub-electrodes 31 and the second sub-electrodes 41 are alternately disposed on the surface of the first glass plate 1 or on the surface of the second glass plate 2, an electric field can always be generated between the first glass plate 1 and the second glass plate 2 so that the electric field transforms the inert gas 5 into the plasma.

Figure 4:
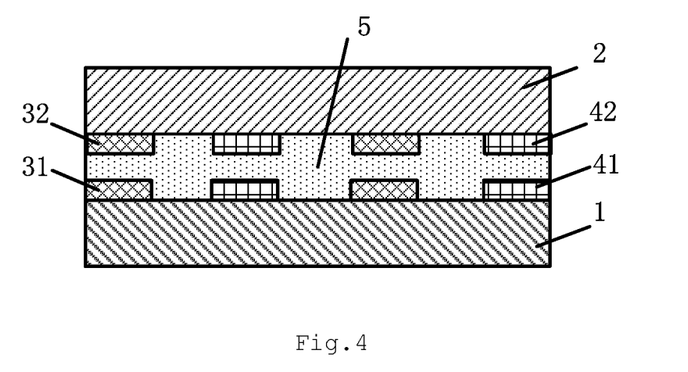
FIG. 4 is a structural diagram of a glass assembly according to still another embodiment of the present disclosure.

FIG. 4 is a structural diagram of a glass assembly according to a still another embodiment of the present disclosure. FIG. 4 differs from FIG. 2 and FIG. 3 in the position of setting the sub-electrode.

In the embodiments shown in FIG. 2 and FIG. 3, the first sub-electrode 31 and the second sub-electrode 41 are alternately disposed on a surface of a glass plate. In the embodiment shown in FIG. 4, the first electrode 3 further includes at least one third sub-electrode 32 in addition to at least one sub-electrode 31. The second electrode 4 includes at least one fourth sub-electrode 42 in addition to at least one second sub-electrode 41. The first sub-electrode 31 and the second sub-electrode 41 are alternately disposed on the surface of the first glass plate 1, and the third sub-electrode 32 and the fourth sub-electrode 42 are alternately disposed on the surface of the second glass plate 2. The first sub-electrode 31 and the adjacent second sub-electrode 41 are spaced apart by a gap, the third sub-electrode 32 and an adjacent fourth sub-electrode 42 are spaced apart by a gap.

In some embodiments, each of the first sub-electrode 31 has the same width and height, each of the second sub-electrode 41 has the same width and height, each of the third sub-electrode 32 has the same width and height, and each of the fourth sub-electrode 42 has the same width and height.

In some embodiments, the first sub-electrode 31 and the third sub-electrode 32 are connected to a positive voltage, and the second sub-electrode 41 and the fourth sub-electrode 42 are grounded. Since there is a potential difference between a first sub-electrode 31 and an adjacent second sub-electrode 41 and there is a potential difference between the third sub-electrode 32 and the fourth sub-electrode 42, an electric field is generated between the first sub-electrode 31 and the adjacent second sub-electrode 41, and an electric field is generated between the third sub-electrode 32 and the adjacent fourth sub-electrode 42 thereby to transform the inert gas 5 into the plasma.

It should be noted that the first sub-electrode 31 and the third sub-electrode 32 are disposed opposite to each other, and the second sub-electrode 41 and the fourth sub-electrode 42 are disposed opposite to each other so as to form an ordered electric field between the first glass plate 1 and the second glass plate 2. In some embodiments, projections of the first sub-electrode 31 and the third sub-electrode 32 on the first glass plate 1 coincide with each other, and projections of the second sub-electrode 41 and the fourth sub-electrode 42 on the first glass plate 1 coincide with each other.

Since there are sub-electrodes alternately disposed on the surfaces of the first glass plate 1 and the second glass plate 2, the electric field intensity between the first glass plate 1 and the second glass plate 2 can be enhanced.

In some embodiments, the third sub-electrode 32 and the fourth sub-electrode 42 are transparent electrodes. For example, the transparent electrodes are made of an ITO film or other transparent conductive films. Thereby, it is possible to prevent the third sub-electrode 32 and the fourth sub-electrode 42 from affecting the user's line of sight.

In some embodiments, the height of the third sub-electrode 32 is smaller than the skin depth of the third sub-electrode 32 in spatial electromagnetic wave, and the height of the fourth sub-electrode 42 is smaller than the skin depth of the fourth sub-electrode 42 in space electromagnetic wave, thereby enabling electromagnetic wave to better pass through the glass assembly. Thus, electromagnetic wave can smoothly pass through the glass assembly when the user does not have a demand of electromagnetic shielding.

In some embodiments, the distance between the third sub-electrode 32 and an adjacent fourth sub-electrode 42 is greater than a width of the third sub-electrode 32 and greater than a width of the fourth sub-electrode 42, in order to make the generated electric field act more fully on the inert gas.

In some embodiments, the third sub-electrode 32 and the fourth sub-electrode 42 are strip-shaped. The third sub-electrode 32 and the fourth sub-electrode 42 extend in the same direction as the first sub-electrode 31 and the second sub-electrode 41. Thereby, the loss of electromagnetic wave when passing through the glass assembly can be better reduced.

In some embodiments, a sum of the heights of the first sub-electrode 31 and the third sub-electrode 32 is smaller than the skin depth of the first sub-electrode 31 or the third sub-electrode 32, and a sum of the heights of the second sub-electrode 41 and the fourth sub-electrode 42 is smaller than the skin depth of the first sub-electrode 31 or the third sub-electrode 32. In other embodiments, the sum of the heights of the first sub-electrode 31 and the third sub-electrode 32 is smaller than the skin depth of the first sub-electrode 31 in space electromagnetic wave, and is smaller than the skin depth of the third sub-electrode 32 in space electromagnetic wave. The sum of the heights of the first sub-electrode 41 and the third sub-electrode 42 is smaller than the skin depth of the second sub-electrode 41 in space electromagnetic wave, and is smaller than the skin depth of the fourth sub-electrode 42 in space electromagnetic wave. With the above arrangement, the electromagnetic wave can smoothly pass through the oppositely disposed first and third sub-electrodes 31 and 32, and the oppositely disposed second and fourth sub-electrode 41 and 42.

Figure 5:
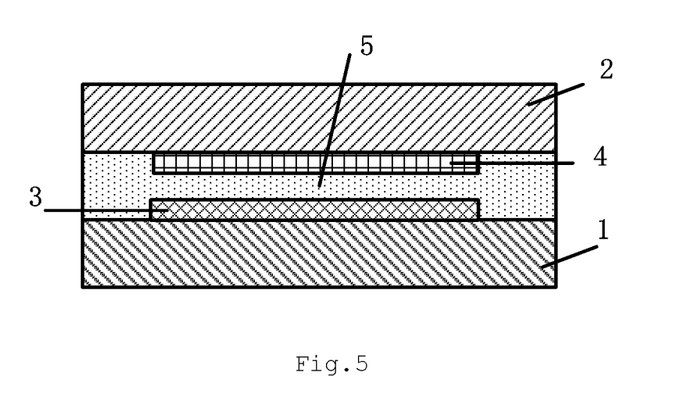
FIG. 5 is a structural diagram of a glass assembly according to still another embodiment of the present disclosure.

FIG. 5 is a structural diagram of a glass assembly according to a still another embodiment of the present disclosure. In the embodiment shown in FIG. 5, the first electrode 3 and the second electrode 4 are disposed opposite to each other.

As shown in FIG. 5, the first electrode 3 is disposed on the surface of the first glass plate 1, and the second electrode 4 is disposed on the surface of the second glass plate 2. In the above embodiment, the inert gas 5 between the first glass plate 1 and the second glass plate 2 is transformed into the plasma by the electric field generated by the first electrode 3 and the second electrode 4.

Figure 6:
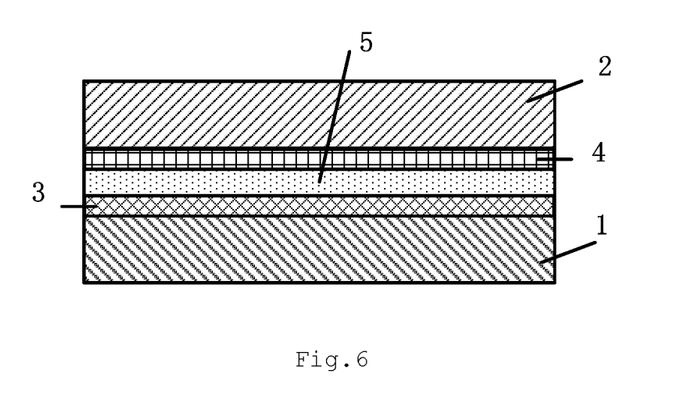
FIG. 6 is a structural diagram of a glass assembly according to still another embodiment of the present disclosure.

FIG. 6 is a structural diagram of a glass assembly according to a still another embodiment of the present disclosure. FIG. 6 differs from FIG. 5 in that the area of the glass plates covered by the electrodes is different.

In the embodiment shown in FIG. 5, the first electrode 3 covers a part of the surface of the first glass plate 1, and the second electrode 4 covers a part of the surface of the second glass plate 2. In the embodiment shown in FIG. 6, the first electrode 3 covers the entire surface of the first glass plate 1, and the second electrode 4 covers the entire surface of the second glass plate 2.

Since the first electrode 3 covers the entire surface of the first glass plate 1, the second electrode 4 covers the entire surface of the second glass plate 2, so that a more uniform electric field can be generated between the first glass plate 1 and the second glass plate 2.

In some embodiments, the distance between the first electrode 3 and the second electrode 4 is between 10 microns and 500 microns, thereby enabling an electric field generated between the first glass plate 1 and the second glass plate 2 to transform the inert gas 5 into the plasma more effectively.

In some embodiments, the first electrode 3 and the second electrode 4 are transparent electrodes. For example, the transparent electrodes are made of an ITO film or other transparent conductive films. Thereby, it is possible to prevent the first electrode 3 and the second electrode 4 from affecting the user's line of sight.

In some embodiments, the height of the first electrode 3 is smaller than a skin depth of the first electrode 3 in spatial electromagnetic wave, and a height of the second electrode 4 is smaller than a skin depth of the second electrode 4 in spatial electromagnetic wave.

In some embodiments, the heights of the first electrode 3 and the second electrode 4 are respectively less than one-fifth of the skin depth. Thus, electromagnetic wave can smoothly pass through the glass assembly when the user does not have a demand of electromagnetic shielding.

Figure 7:
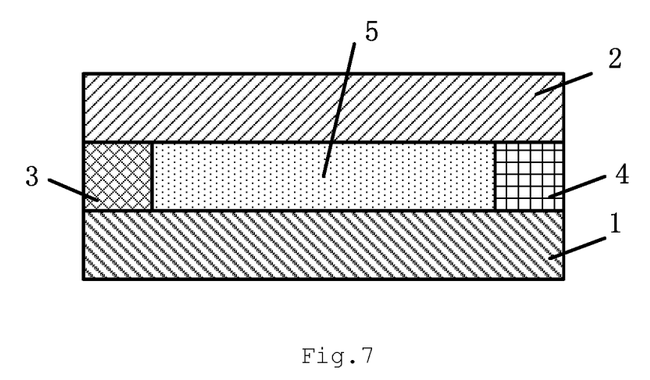
FIG. 7 is a structural diagram of a glass assembly according to still another embodiment of the present disclosure.

FIG. 7 is a structural diagram of a glass assembly according to a still another embodiment of the present disclosure. FIG. 7 differs from FIG. 6 in the positions of setting the electrodes.

In the embodiment shown in FIG. 6, the first electrode 3 covers the surface of the first glass plate 1, and the second electrode 4 covers the surface of the second glass plate 2. In the embodiment shown in FIG. 7, the first electrode 3 and the second electrode 4 are disposed on opposite edges of the glass assembly. FIG. 7 is a top view of the glass assembly.

In some embodiments, the first electrode 3 and the second electrode 4 are metal electrodes. Since the first electrode 3 and the second electrode 4 are disposed on opposite edges of the glass assembly and do not affect the user's line of sight, an opaque metal electrode can be used. In some embodiments, a metal film is plated on the substrate to form an electrode by using a photo spacer as a substrate.

Figure 8:
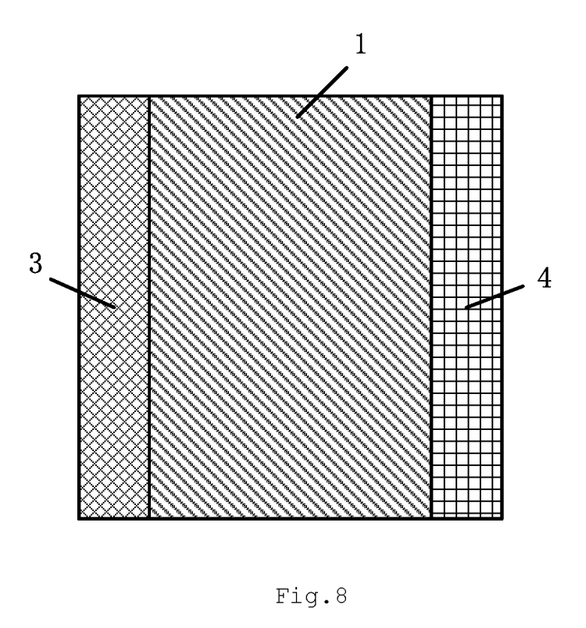
FIG. 8 is a front view of the embodiment shown in FIG. 7.

FIG. 8 is a front view of the embodiment shown in FIG. 7.

In the embodiment shown in FIG. 8, the first electrode 3 and the second electrode 4 are respectively disposed on the two opposite, left and right, sides of the glass assembly, respectively.

In other embodiments, the first electrode 3 and the second electrode 4 may also be disposed on the two opposite, upper and lower, edges of the glass assembly, respectively.

Figure 9:
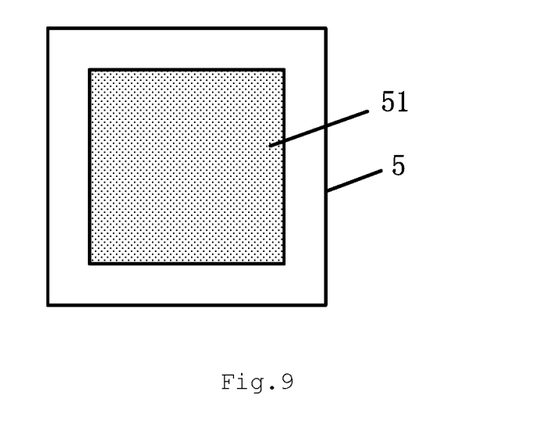
FIG. 9 is a structural diagram of a glass window according to one embodiment of the present disclosure.

FIG. 9 is a schematic structural view of a glass window according to one embodiment of the present disclosure.

As shown in FIG. 9, a glass window 5 includes a glass assembly 51. The glass assembly 51 is the one involved in any of the embodiments of FIG. 1-FIG. 8.

In the case where the user does not have a demand of electromagnetic shielding, the first electrode 3 and the second electrode 4 in the glass assembly 51 are not applied with voltage, and the glass window 5 is not different from an ordinary glass window in use.

The voltage is applied to the first electrode 3 and the second electrode 4 in the glass assembly 51 in the case where the user has a demand of electromagnetic shielding, thereby generating a potential difference between the first electrode 3 and the second electrode 4. Thereby, an electric field is generated between the first glass plate 1 and the second glass plate 2, and the electric field transforms the inert gas 5 into the plasma to electromagnetically shield space electromagnetic wave.

If the voltage applied to the first electrode 3 and the second electrode 4 is canceled, the potential difference between the first electrode 3 and the second electrode 4 is zero. The electric field between the first glass plate 1 and the second glass plate 2 also disappears, and the inert gas 5 returns to the original state. In this case, the inert gas 5 no longer has an electromagnetic shielding function for electromagnetic wave, and the electromagnetic wave can freely pass through the glass assembly.

Figure 10:
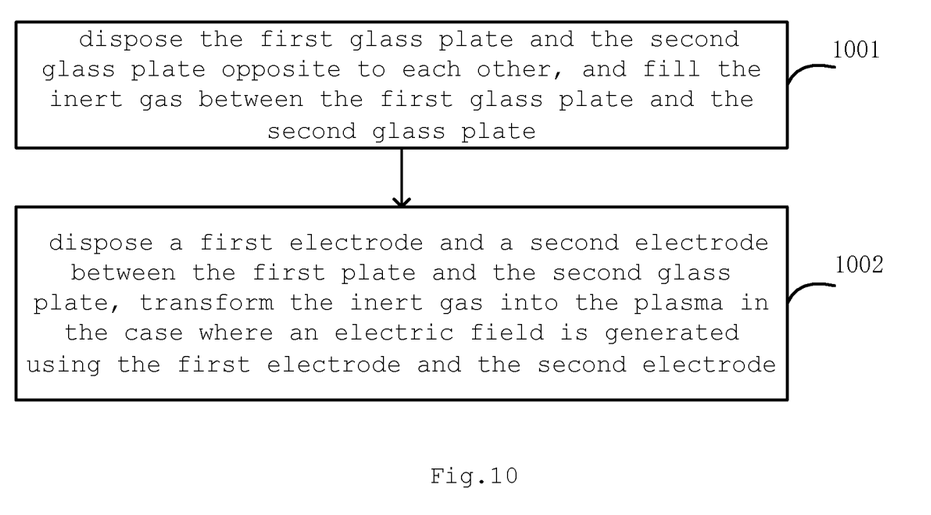
FIG. 10 is a flow diagram of a method of making a glass assembly according to one embodiment of the present disclosure.

FIG. 10 is a flow diagram of a method of making a glass assembly according to one embodiment of the present disclosure.

In step 1001, the first glass plate and the second glass plate are disposed opposite to each other, and the inert gas is filled between the first glass plate and the second glass plate.

In step 1002, a first electrode and a second electrode are disposed between the first plate and the second glass plate, the inert gas is transformed into the plasma in the case where an electric field is generated using the first electrode and the second electrode.

It should be noted that the first electrode and the second electrode can be set according to the embodiments shown in FIG. 1-FIG. 8. Thereby, in the case where there is a potential difference between the first electrode and the second electrode, an electric field is generated between the first glass plate and the second glass plate to transform the inert gas into the plasma.

Up to this point, the embodiments of the present disclosure have been described in detail. In order to avoid obscuring the concepts of the present disclosure, some details known in the art are not described. Those skilled in the art can totally understand how to implement the technical solution disclosed here according to the above description.

Although some specified embodiments of the present disclosure have been explained in detail by the examples, those skilled in the art shall understand that the above examples are only intended for making explanation rather than for limiting the scope of the present disclosure. Those skilled in the art shall understand that the above embodiments can be amended or equivalent substitute of part of the technical features can be performed without deviating from the scope and spirit of the present disclosure. The scope of the present disclosure is defined by the following claims.

What is claimed is:

1. A glass assembly, comprising:
a first glass plate and a second glass plate disposed opposite to each other, wherein inert gas is filled between the first glass plate and the second glass plate;
a first electrode and a second electrode disposed between the first glass plate and the second glass plate, wherein the inert gas is transformed into plasma responsive to an electric field generated using the first electrode and the second electrode.

2. The glass assembly according to claim 1, wherein the first electrode comprises at least one first sub-electrode, and the second electrode comprises at least one second sub-electrode;
the at least one first sub-electrode and the at least one second sub-electrode are alternately disposed on a surface of the first glass plate.

3. The glass assembly according to claim 2, wherein the at least one first sub-electrode and the at least one second sub-electrode are strip-shaped; and
the at least one first sub-electrode and the at least one second sub-electrode extend in the same direction.

4. The glass assembly according to claim 3, wherein on a surface of the first glass plate, a distance between the at least one first sub-electrode and the at least one second sub-electrode adjacent to the at least one first sub-electrode is greater than a width of the at least one first sub-electrode and greater than a width of the at least one second sub-electrode.

5. The glass assembly according to claim 3, wherein on a surface of the first glass plate, a height of the at least one first sub-electrode is smaller than a skin depth of the at least one first sub-electrode in spatial electromagnetic wave, and a height of the at least one second sub-electrode is smaller than a skin depth of the at least one second sub-electrode in spatial electromagnetic wave.

6. The glass assembly according to any of claim 2, wherein
the first electrode further comprises at least one third sub-electrode, and the second electrode comprises at least one fourth sub-electrode;
the at least one third sub-electrode and the at least one fourth sub-electrode are alternately disposed on a surface of the second glass plate.

7. The glass assembly according to claim 6, wherein
the at least one third sub-electrode and the at least one fourth sub-electrode are strip-shaped;
the at least one third sub-electrode and the at least one fourth sub-electrode extend in the same direction as the at least one first sub-electrode and the at least one second sub-electrode.

8. The glass assembly according to claim 7, wherein
a distance between the at least one third sub-electrode and the at least one fourth sub-electrode which is adjacent to the at least one third sub-electrode is greater than a width of the at least one third sub-electrode and greater than a width of the at least one fourth sub-electrode on a surface of the second glass plate.

9. The glass assembly according to claim 7, wherein
on a surface of the second glass plate, a height of the at least one third sub-electrode is smaller than a skin depth of the at least one third sub-electrode in spatial electromagnetic wave, and a height of the at least one fourth sub-electrode is smaller than a skin depth of the at least one fourth sub-electrode in spatial electromagnetic wave.

10. The glass assembly according to claim 6, wherein
projections of the at least one first sub-electrode and the at least one third sub-electrode on the first glass plate coincide with each other;
projections of the at least one second sub-electrode and the at least one fourth sub-electrode on the first glass plate coincide with each other.

11. The glass assembly according to claim 10, wherein
a sum of a height of the at least one first sub-electrode and a height of the at least one third sub-electrode is smaller than a skin depth of the at least one first sub-electrode in spatial electromagnetic wave, and is smaller than a skin depth of the at least one third sub-electrode in spatial electromagnetic wave;
a sum of a height of the at least one second sub-electrode and a height of the at least one fourth sub-electrode is smaller than a skin depth of the at least one second sub-electrode in spatial electromagnetic wave, and is smaller than a skin depth of the at least one fourth sub-electrode in spatial electromagnetic wave.

12. The glass assembly according to claim 6, wherein
the at least one first sub-electrode, the at least one second sub-electrode, the at least one third sub-electrode and the at least one fourth sub-electrode are transparent electrodes.

13. The glass assembly according to claim 1, wherein
the first electrode and the second electrode are disposed opposite to each other.

14. The glass assembly according to claim 13, wherein
the first electrode is disposed on a surface of the first glass plate;
the second electrode is disposed on a surface of the second glass plate.

15. The glass assembly according to claim 14, wherein
a height of the first electrode is smaller than a skin depth of the first electrode in spatial electromagnetic wave;
a height of the second electrode is smaller than a skin depth of the second electrode in spatial electromagnetic wave.

16. The glass assembly according to claim 14, wherein
the first electrode and the second electrode are transparent electrodes.

17. The glass assembly according to claim 13, wherein
the first electrode and the second electrode are disposed on opposite edges of the glass assembly.

18. The glass assembly according to claim 17, wherein
the first electrode and the second electrode are metal electrodes.

19. A glass window comprising the glass assembly according to claim 1.

20. A method of manufacturing a glass assembly, comprising:
disposing a first glass plate and a second glass plate opposite to each other, wherein inert gas is filled between the first glass plate and the second glass plate;
disposing a first electrode and a second electrode between the first glass plate and the second glass plate, wherein the inert gas is transformed into plasma responsive to an electric field generated using the first electrode and the second electrode.

* * * * *